United States Patent
Ottermann et al.

(10) Patent No.: US 7,268,486 B2
(45) Date of Patent: Sep. 11, 2007

(54) HERMETIC ENCAPSULATION OF ORGANIC, ELECTRO-OPTICAL ELEMENTS

(75) Inventors: Clemens Ottermann, Hattersheim (DE); Oliver Fritz, Landshut (DE); Dietrich Mund, Obersüssbach (DE); Jörn Pommerehne, Gau-Weinheim (DE)

(73) Assignee: Schott AG, Mainz (DE)

( * ) Notice: Subject to any disclaimer, the term of this patent is extended or adjusted under 35 U.S.C. 154(b) by 0 days.

(21) Appl. No.: 10/231,966

(22) Filed: Aug. 30, 2002

(65) Prior Publication Data

US 2003/0193286 A1    Oct. 16, 2003

(30) Foreign Application Priority Data

Apr. 15, 2002 (DE) .......................... 202 05 830 U
May 23, 2002 (DE) ............................ 102 22 958

(51) Int. Cl.
*H01J 1/62* (2006.01)
*B32B 9/00* (2006.01)

(52) U.S. Cl. .................... 313/504; 313/509; 428/690; 427/66

(58) Field of Classification Search ................ 445/24; 313/506, 504, 509, 512; 428/690; 257/98, 257/100; 427/66
See application file for complete search history.

(56) References Cited

U.S. PATENT DOCUMENTS

| | | | |
|---|---|---|---|
| 4,104,418 A | 8/1978 | Park et al. | |
| 5,607,789 A | 3/1997 | Treger et al. | |
| 5,652,067 A | 7/1997 | Ito et al. | |
| 5,821,692 A | 10/1998 | Rogers et al. | |
| 5,841,230 A * | 11/1998 | Ikoma et al. | 313/506 |
| 5,882,761 A | 3/1999 | Kawami et al. | |
| 5,962,962 A | 10/1999 | Fujita et al. | |
| 6,107,452 A | 8/2000 | Miller et al. | |
| 6,160,346 A * | 12/2000 | Vleggaar et al. | 313/512 |
| 6,198,220 B1 * | 3/2001 | Jones et al. | 313/512 |
| 6,262,433 B1 * | 7/2001 | Arai et al. | 257/40 |
| 6,278,237 B1 * | 8/2001 | Campos | 313/512 |
| 6,307,317 B1 * | 10/2001 | Codama et al. | 313/504 |
| 6,392,339 B1 * | 5/2002 | Aziz et al. | 313/504 |
| 6,476,783 B2 * | 11/2002 | Matthies et al. | 345/82 |
| 6,525,466 B1 * | 2/2003 | Jabbour et al. | 313/504 |
| 6,596,040 B2 * | 7/2003 | Saak et al. | 51/307 |

FOREIGN PATENT DOCUMENTS

EP    0 573 549 B1    2/1992

(Continued)

OTHER PUBLICATIONS

English translation of Detailed Description of JP 11-097169.*

(Continued)

*Primary Examiner*—Edward J. Glick
*Assistant Examiner*—Thomas R. Artman
(74) *Attorney, Agent, or Firm*—Ohlandt, Greeley, Ruggiero & Perle, L.L.P.

(57) ABSTRACT

A process for producing organic, electro-optical elements includes the steps of: providing a substrate, applying a first conductive layer, applying at least one layer which includes at least one organic, electro-optical material, applying a second conductive layer, and depositing at least one layer with a vitreous structure.

37 Claims, 5 Drawing Sheets

FOREIGN PATENT DOCUMENTS

| | | |
|---|---|---|
| EP | 0 573 549 B2 | 2/1992 |
| EP | 0 776 147 B1 | 5/1997 |
| EP | 0 800 563 B1 | 10/1997 |
| EP | 0 977 469 A2 | 2/2000 |
| EP | 1 006 169 A1 | 6/2000 |
| JP | 11097169 | 4/1999 |
| JP | 2000277253 | 10/2000 |
| WO | WO92/16023 | 9/1992 |
| WO | WO96/20253 | 7/1996 |

OTHER PUBLICATIONS

Patent Abstracts of Japan, Publication 07211456 A, Application No. 06017907, Jan. 18, 1994, Applicant Idemitsu, English Abstract, Publication Date Aug. 11, 1995.

* cited by examiner

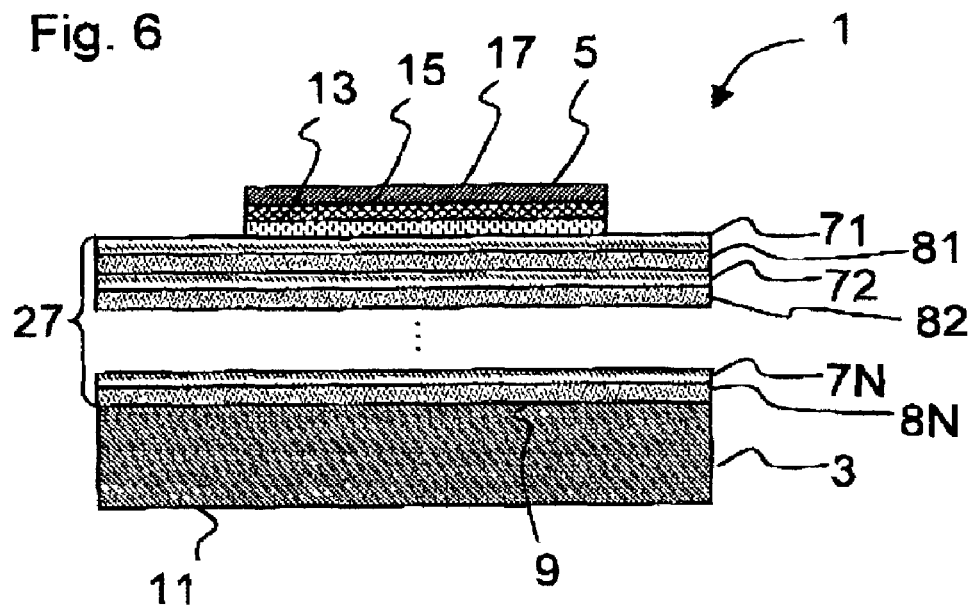
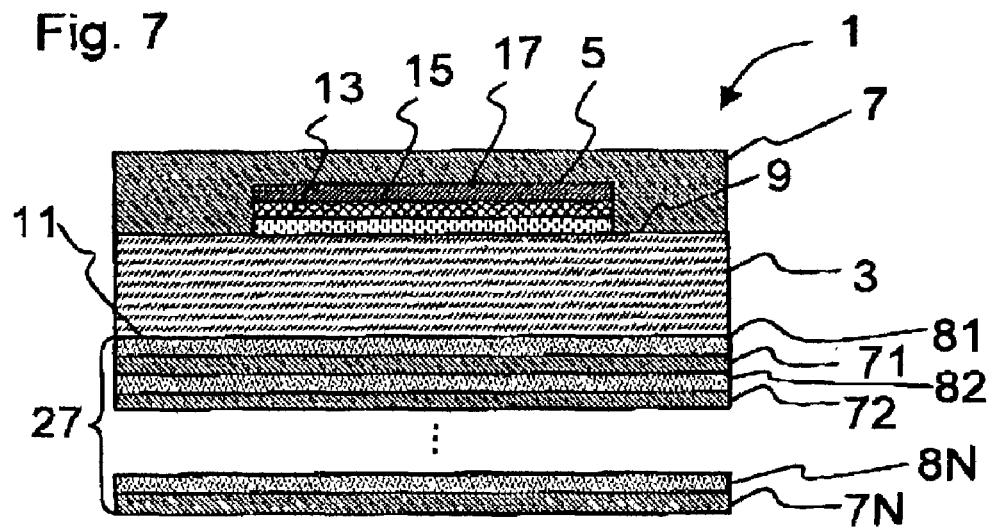

HERMETIC ENCAPSULATION OF ORGANIC, ELECTRO-OPTICAL ELEMENTS

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

The invention relates in general terms to organic, electro-optical elements, and to a process for producing them. In particular, the invention relates to a process for producing hermetically encapsulated organic, electro-optical elements, and to a hermetically encapsulated electro-optical element.

TECHNICAL FIELD

Organic light-emitting diodes (OLEDs) are the subject of intensive development work, since they have a number of advantages over other illumination and display means. For example, OLEDs can be made very thin and even flexible. Moreover, compared to liquid-crystal displays, OLEDs have the benefit of being self-illuminating.

However, the main problem with OLEDs is their service life, which has hitherto been very limited. It has proven almost impossible to extend the operating time of OLEDs to more than 5000 operating hours. Metal cathodes with a low work function are generally used for OLEDs. In this context, inter alia metallic calcium is customary. However, these materials with a low work function are generally highly reactive. Chemical reactions undergone by the metal layer and associated changes in the work function are considered to be one of the main factors limiting the service life.

In particular the reaction with air or with the water which is present as humidity in the air is responsible in this context for the degradation of the metal electrode of an OLED.

To solve the problem, U.S. Pat. No. 5,882,761 proposes an OLED in which the OLED structures are covered with a curved metal sheet. In addition, the OLED described in that document has a reservoir of drying agent or getter. The drying-agent reservoir and the OLED structures are separated from one another by a porous adhesive tape. The metal sheet is joined to the glass substrate by means of a TV adhesive. A drawback of this solution is that organic layers, such as the bonding area between metal sheet and glass substrate, are relatively easy for small gas molecules to penetrate. Therefore, the adhesive bonding represents a passage, in particular for atmospheric oxygen and water. Therefore, it is only a question of time until the drying agent is exhausted and degradation of the metal electrode commences. Furthermore, this type of encapsulation makes it impossible to implement significant properties of the OLED technology, such as the encapsulation of extremely thin or flexible components.

Examples of known getter materials are liquids such as those described in JP 7211456, U.S. Pat. No. 5,821,692, or U.S. Pat. No. 5,962,962. Furthermore, EP 0776147 describes the use of solid-state materials as getters. As disclosed in WO 99/03112, gases can also be used as getter medium for organic components. However, a common feature of all the solutions which are known from the prior art is that the efficiency of the getter material falls as the incidence of gas continues, and consequently there is no permanent protection against degradation.

Therefore, the invention is based on the object of slowing the degradation of organic, electro-optical elements, such as for example OLEDs, and of increasing their service life.

SUMMARY OF THE INVENTION

This object is achieved, in a very surprisingly simple way, by a process for producing an organic, electro-optical element as claimed in claim 1 and by an organic, electro-optical element as claimed in claim 28. Advantageous refinements are in each case given in the dependent claims.

Accordingly, the process according to the invention for producing an organic, electro-optical element comprises the steps of:

providing a substrate, applying a first conductive layer, applying at least one layer (15) which includes at least one organic, electro-optical material,— applying a second conductive layer, and the step of depositing at least one layer (7, 71, 72, . . . 7N) with a vitreous structure.

Layers with a vitreous structure are known for their extremely good barrier action. In this context, a layer without a long-range order of the elements and/or substances which make up the material with a vitreous structure and, at the same time, with a close-range order of the substances and/or elements is to be understood as a layer with a vitreous structure. Therefore, the term layer with a vitreous structure denotes a vitreous, amorphous layer. Accordingly, layers of this type do not only comprise glasses. Rather, vitreous layers may also encompass, for example, organic materials, alloys or amorphous element layers. Compared to non-vitreous, i.e. substantially microcrystalline, polycrystalline or crystalline layers, the layers which are applied by means of the process according to the invention are distinguished by the absence of grain boundaries, inter alia on account of the amorphous structure. However, grain boundaries of this type are in fact essentially responsible for the higher permeability rate to small molecules, such as for example oxygen or water, through crystalline or polycrystalline media.

By contrast, there are numerous known glasses which, even at layer thicknesses of 50 μm, do not have permeability to all gases with the exception of helium which can be recorded using measurement technology. A summary of diffusion rates through glasses is to be found, for example, in "Handbook of Gas Diffusion in Solids and Melts". However, helium itself, since it is inert, does not affect the layers of the OLED and is therefore of no importance in connection with the service life of OLEDs.

The term an organic, electro-optical material encompasses both an organic material which has electroluminescent properties and is therefore suitable for the construction of an OLED and an organic material which has photovoltaic properties. In the following text, for the sake of simplicity the term OLED is used in general terms for light-converting elements, i.e. both for light-emitting elements and for photovoltaic elements, on account of their equivalent structure.

A wide range of substances which are known to the person skilled in the art can be used as organic, electro-optical material. Inter alia, metal-organic materials, in particular metal-organic complexes, such as triplet emitters or lanthanide complexes, can be used for this purpose. By way of example, tris-(8-hydroyquinolino)-aluminum (Alq3) or MEH-PPV (poly(2-methoxy, 5-(2'-ethyl)-hexyloxy) paraphenylene vinylene) is used as electroluminescent material. The layer may also comprise an organic or inorganic matrix layer which is doped with emitters, such as for example fluorescent dyes, as organic, electro-optical material. The inorganic matrix used was, inter alia, porous titanium dioxide.

Further electroluminescent substances are described, for example, in U.S. Pat. No. 6,107,452, EP 0 573 549, EP 800563 A1, EP 800563 B1 and EP 1006169 A1, which are completely incorporated by reference in the present application. Although it is known to the person skilled in the art, reference is also made to the structure of the OLEDs described in these documents, and this description is assumed to form part of the present application.

Moreover, the inventive deposition creates an intimate join between the layer with a vitreous structure and the material below it without the formation of cavities or joining points which can be penetrated by gases, since the layer grows directly on the surface below it. Layers with a vitreous structure, i.e. substantially without crystalline partial regions or subregions are, moreover, distinguished by better tolerance with respect to mechanical loads compared to crystalline materials. This means that the very good barrier actions of such materials are retained even in the event of deformation within the mechanical load limits of the material. Therefore, the process according to the invention even makes it possible to produce flexible OLEDs with a high service life.

To deposit the layer with a vitreous structure, it is possible, inter alia, to use PVD or CVD processes. It is also possible for a plurality of deposition processes to be combined with one another. PVD or CVD is advantageous inter alia because these processes can be carried out in vacuo and/or in a dry atmosphere.

According to a particularly preferred embodiment, the at least one layer with a vitreous structure is deposited by evaporation-coating. Evaporation-coating makes it possible to achieve high layer growth rates, which makes this variant of the process according to the invention particularly fast and therefore economical for large numbers.

By way of example, electron-beam coating is particularly suitable for the evaporation-coating. For this purpose, an electron beam is directed onto a target and the impact causes the electrons to release their kinetic energy to the target, which is heated as a result. Ultimately, the target material is evaporated by the heating. The evaporated material then comes into contact with the surface which is to be coated, where it is deposited as a layer with a vitreous structure.

The step of evaporation-coating with a layer with a vitreous structure may, moreover, comprise the step of co-evaporation from at least two evaporation sources. In this way, it is possible, for example, to adjust the stoichiometry of the layer which is deposited by means of the evaporation-coating rates of the sources. In particular, the step of co-evaporation may also comprise the step of varying, in particular periodically varying, the evaporation-coating rate of at least one of the evaporation sources. The material properties of the layer with a vitreous structure in the direction perpendicular to the evaporation-coated surface can be influenced and adapted by varying the evaporation-coating rates. For example, by varying the layer stoichiometry, it is possible, for example, to match the coefficient of thermal expansion of the layer to that of the coated surface, so that thermal stresses between the surface material and the evaporation-coated layer are avoided or reduced. A periodic variation in the evaporation-coating rates can be used, for example, to produce periodic variations in the refractive index in the evaporation-coating layer perpendicular to the coated surface.

However, the deposition by evaporation-coating generally requires special evaporation-coating materials with relatively high vapor pressures. Since for special OLED applications materials with low vapor pressures and, correspondingly, generally high melting points may also be suitable, the step of depositing at least one layer with a vitreous structure by means of physical and/or chemical vapor deposition may also advantageously comprise the step of sputtering on a layer with a vitreous structure. In this context, the term sputtering on layers is understood as meaning one of the PVD processes. The sputtering of layers, unlike evaporation-coating, can be carried out even with materials which are relatively difficult to evaporate.

However, layers with vitreous structures can also advantageously be produced using other processes, for example chemical vapor deposition, for example by means of plasma-enhanced chemical vapor deposition (PCVD). In this respect, in particular plasma impulse chemical vapor deposition (PICVD) is particularly suitable; in this process, the plasma is not produced constantly over the course of time, but rather in pulsed fashion, which inter alia leads to a lower thermal load on the element which is to be coated.

Moreover, the deposition of the layer with a vitreous structure may also, in an advantageous configuration of the process, comprise the step of co-deposition of an organic material. The co-deposition, or simultaneous deposition, of the organic material together with the layer material which forms a layer with a vitreous structure may be effected, for example, by co-evaporation or deposition from the residual gas atmosphere. In this case, the molecules of the organic material are incorporated in the layer with a vitreous structure. The organic material may have a positive influence on the layer properties in many ways. By way of example, in this context mention may be made of a higher flexibility of the layer under mechanical load, the matching of optical and mechanical properties, the improvement to the layer bonding for example as a result of the layer being deposited as a gradient layer with a change in the organic content, the change in the packing density and the layer microstructure, and the influencing of the chemical properties of the layer, in particular by adding hydrophobic materials or getter materials.

The layers are advantageously applied in such a way that one of the conductive layers has a lower work function than the other conductive layer. On account of the difference in work function between the first and second conductive layers, which are used as electrodes and between which the layer which includes an organic, electro-optical material is located, given correct polarity of the voltage applied to the electrodes, electrons are injected at the layer acting as a cathode into unoccupied electronic states of the organic, electro-optical material. At the same time, defect electrons or holes are injected from the layer with a lower work function, which is acting as an anode, with the result that light quanta are emitted in the organic material as a result of recombination of the electrons with the defect electrons.

In many cases, additional functional layers, which are applied in particular between the first and second conductive layers, are used to produce OLEDs. Accordingly, the process may advantageously also include the step of applying at least one hole injection layer and/or a potential matching layer and/or an electron blocker layer and/or a hole blocker layer and/or an electron conductor layer and/or a hole conductor layer and/or an electron injection layer. Particularly high quantum or light efficiency yields are achieved by applying the layers in the following preferred sequence: potential matching layer/hole injection layer/electron blocker layer/layer which includes at least one electro-optical material/hole blocker layer/electron conductor layer/electron injection layer/potential matching layer.

For the sake of simplicity, the sequence of functional layers of the organic, electro-optical element is referred to below as the OLED layer structure. This comprises in particular the first and second conductive layers and the layer which includes an organic, electro-optical material. In addition, the OLED layer structure may also comprise, for example, the further functional layers mentioned above.

To allow light to be output or input, it is advantageous if one of the conductive layers is at least partially transparent. Inter alia, indium tin oxide or fluorine-doped tin oxide ($SnO_2$:F) has proven suitable for this layer.

A further advantage of the process is that the order in which the layers are applied is not immutable. Generally, OLEDs are produced by applying a transparent conductive layer to a transparent substrate, and then depositing the layer which includes an organic, electro-optical material on the transparent conductive layer. This structure is then covered by a conductive layer, which for example may have a lower work function than the transparent conductive layer, as further electrode. In this case, the light which is emitted can be output or introduced via the transparent substrate.

According to a preferred configuration of the process, the step of depositing the at least one layer with a vitreous structure takes place after the application of the at least one layer which includes at least one organic, electro-optical material and of the first and second conductive layers. If these layers are applied from the same side of the substrate, for example by being deposited, the layer which includes at least one organic, electro-optical material is located between the substrate and the layer with a vitreous structure. In this way, the OLED layer structure is encapsulated between the substrate and the layer with a vitreous structure.

Since the layers with a vitreous structure which are applied in accordance with the invention may, for example, also themselves be transparent, it is also possible, however, for the layer sequence to be arranged in such a way that the transparent conductive layer is applied to the substrate after the layer with the organic, electro-optical material. In this way, it is also possible to produce an OLED with, for example, a non-transparent substrate, in which case the light passes through the layer with a vitreous structure and the transparent conductive layer.

It is advantageously also possible for one or both of the conductive layers and also the layer which includes an organic, electro-optical material to be applied or deposited in structured form. In particular, these layers may also be produced in structured form in the lateral direction, i.e. along the surface. Structuring of this nature allows a large number of properties of such elements to be influenced. By way of example, light-passage openings can be created in a conductive layer. Furthermore, a layer arrangement in which the layers do not necessarily have to be applied on top of one another is also possible. Rather, it is possible, by way of example, for structured layers to intermesh with one another. By way of example, the first and/or second conductive layers may also be applied in such a manner that they are structured in the form of a comb. The layer which includes at least one organic, electro-optical material may then, for example, be located completely or partially between the comb structures. Moreover, structuring is appropriate for pixelated structures which are operated by dedicated switching elements, or for the production of an organic electro-optical element as an active matrix display.

Layers with a vitreous structure which comprise an at least binary system of materials are particularly suitable for hermetic encapsulation of OLEDs. Layers of this type are generally distinguished by particularly low permeability rates, since they have scarcely any tendency to form crystalline areas, unlike quartz glasses, for example, and they also have denser structures. Such at least binary systems of materials may, for example, be composed of at least two metal oxides or silicon dioxide and one or more metal oxides.

Furthermore, the process may also be configured in such a way that the step of depositing the at least one layer with a vitreous structure takes place before the application of one of the conductive layers. As a result, the layer with a vitreous structure is located between the substrate and the OLED layer structure. One such variant of the process produces an OLED in which the diffusion through the substrate into the OLED layer structure can also be suppressed. This also makes it possible to achieve hermetic encapsulation on the substrate side of the OLED. This is advantageous, for example, for flexible OLEDs if the substrate comprises a flexible plastic material which typically has a high permeability to small gas molecules. The vitreous layer can in this case also fulfil the function of an outputting or introduction layer for the light emitted by the OLED, in order to increase the yield of the OLED by matching the refractive indices.

Moreover, the at least one layer with a vitreous structure may be applied to the opposite side of the substrate from the side to which the layer which includes an organic, electro-optical material is applied. Therefore, the layer is applied to that side of the substrate on which the light is output into the environment in a standard layer structure of the OLED. In this case too, matching of the refractive indices by means of the layer with a vitreous structure can increase the output efficiency, since otherwise there is a considerable change in refractive index, with correspondingly strong back reflections, in particular at the material/air interface. In addition, a layer of this type can also create a diffusion barrier in order to lengthen the service life of the OLED.

A refinement of the process according to the invention for producing OLEDs in which the step of applying a layer with a vitreous structure by means of physical and/or chemical vapor deposition comprises the step of applying a multiple layer is also highly advantageous for the properties of OLEDs. The plurality of individual layers of a multiple layer of this type may, for example, have different chemical compositions, so that, for example, barrier actions of individual layers can be tailored to specific gases which have an adverse effect on the service life. The mechanical properties, such as for example the flexibility, layer bonding or intrinsic layer stress, can also be improved, for example by the introduction of flexible interlayers. Not all the individual layers of the multiple layer have to have a vitreous structure. Rather, individual layers with a vitreous layer material can be combined with other individual layers of different chemical composition, such as for example metal layers or organic layers, such as in particular polymer layers, in order to match the chemical and physical layer properties to the specific requirements. Accordingly, in this refinement of the process according to the invention, the step of applying a multiple layer comprises the step of applying a multiple layer with different chemical compositions and/or different mechanical properties in at least two of the individual layers. In this context, it is also possible to combine different production processes for the individual layers, for example adhesive bonding, dip-coating or spin-coating, with one another and with the deposition of at least one layer with a vitreous structure.

In particular, the plurality of individual layers can also be applied in such a way that at least two of the individual layers have different refractive indices. This can be achieved by applying different layer materials. However, it is also possible to influence the refractive index by the selection of process parameters during application, for example the selection of the evaporation-coating rate. A multiple layer with a varying refractive index of this type is particularly suitable for matching refractive indices.

In many deposition processes for layers with a vitreous structure, a certain thermal load is applied to the OLED layer structure and may have adverse effects on the layers. In particular, the thermal load may affect the layer composition in CVD or PVD coatings. To reduce adverse effects from the thermal load, it is additionally possible for at least one pre-encapsulation layer to be applied. A pre-encapsulation coating of this type may, for example, reduce the heat transfer and thus prevent the OLED layers from being heated.

Moreover, by way of example, a suitable pre-encapsulation coating can prevent the layer with a vitreous structure penetrating or chemically changing another layer during application by means of PVD or CVD coating. This may be the case, for example, with the second conductive layer if the latter is made from very soft or reactive metals, such as for example calcium.

Moreover, the process may advantageously comprise the step of applying a cover. To protect the generally very thin layer with a vitreous structure or the other layers of the OLED from damage, the cover can be applied to the layer with a vitreous structure.

Moreover, however, it is also possible to apply a layer with a vitreous structure in such a way that the contact surface between the cover and the substrate is sealed and hermetically closed up by the layer with a vitreous structure. For this purpose, the step of depositing at least one layer with a vitreous structure comprises the step of covering the boundary edge of the bearing surface of the cover with at least one layer with a vitreous structure. This can not only achieve the objective of providing a hermetic seal, but also allows the evaporation-coating glass to be used to secure the cover, in a similar manner to a soldering glass. The term the bearing surface is not to be understood strictly as the surface on which the contact points between further components and the cover are formed. For example, since the OLED layer structure is generally slightly elevated, there may be a short distance between the cover and the corresponding base, for example the substrate, in adjoining regions next to the OLED layer structure. However, these regions are also to be understood as part of the bearing surface. Therefore, the bearing surface can be understood as a projection surface of that side of the cover which faces the base onto the base.

Furthermore, the process according to the invention can advantageously be improved if it additionally comprises the step of applying at least one bonding layer, in particular a bonding layer to which the at least one layer with a vitreous structure is applied. A layer of this type can in particular improve the bonding properties of the layer with a vitreous structure on plastic surfaces, which has advantageous effects on the mechanical stability of the layer microstructure under thermal or mechanical loads, for example a bending load. In this way, a continuous layer is produced more quickly and it is possible to achieve smoother layers with a lower porosity.

The invention also provides an organic photoelectric element which is produced in particular using the process described above. Accordingly, an element according to the invention comprises:

a substrate,
a first conductive layer,
at least one layer which includes at least one organic, electro-optical material, and
a second conductive layer, as well as
a deposited layer with a vitreous structure.

As has already been described above in connection with the process for producing OLEDs, a layer with a vitreous structure is particularly suitable as a diffusion barrier for small molecules and therefore provides effective protection against degradation of the element. The fact that the layer is deposited on a surface of the element means that there is a join between the layer and the surface without intermediate or transition layers, which is particularly expedient with a view to achieving a hermetic seal. The layer is preferably deposited on the surface by means of CVD and/or PVD, for example by sputtering, evaporation-coating, PCVD or PICVD.

It is preferable for one of the conductive layers to have a lower work function than the other conductive layer, in order to create a difference in work function between the layers. In the case of a light-emitting element, when a voltage is applied to the conductive layers electrons are injected from the layer with a lower work function into unoccupied energy states. Recombination with defect electrons which are injected from the layer with a higher work function then leads to light quanta being emitted.

To increase the quantum efficiency of an OLED according to the invention, the OLED may additionally have further functional layers. In this context, by way of example, at least one hole injection layer and/or at least one potential matching layer and/or at least one electron blocker layer and/or at least one hole blocker layer and/or at least one electron conductor layer and/or hole conductor layer and/or at least one electron injection layer are advantageous.

To allow the emitted light quanta to be output, it is advantageous if one of the conductive layers is at least partially transparent to the light emitted by the layer which includes an organic, electro-optical material. These required properties may be fulfilled, inter alia, if the first conductive layer includes indium tin oxide or fluorine-doped tin oxide.

Moreover, the at least one layer with a vitreous structure does not have to be located on that side of the substrate on which the layer which includes the organic electro-optical material is located. Rather, the layer with a vitreous structure may also be arranged on the opposite side of the substrate from this side. In this way, it is on the one hand possible to limit the diffusion of gas molecules through the substrate and on the other hand also to have a positive influence on, for example, the optical properties of the OLED, for example as a result of the layer with a vitreous structure creating matching of refractive indices.

The at least one layer with a vitreous structure may, furthermore, have a composition and/or refractive index which varies along the direction perpendicular to the coated surface. A variation in the composition perpendicular to the surface allows the layer to have correspondingly varying materials properties in this direction, for example a varying coefficient of thermal expansion or refractive index. However, the refractive index can also be influenced in other ways, for example by the morphology of the layer. In particular, the composition and/or refractive index can also vary periodically. A layer with a vitreous structure and a periodically varying refractive index is particularly suitable for outputting or introducing light into the element.

The at least one layer with a vitreous structure may also particularly advantageously be arranged between the substrate and the first or second conductive layer. This arrangement also suppresses the diffusion of gas molecules through the substrate. Moreover, in this way it is possible to produce refractive index matching between the OLED layer structure and the substrate.

The organic, electro-optical element may also include a multiple layer which comprises at least one layer with a vitreous structure. This may be advantageous both for the optical properties, or in particular for the outputting or introduction of light, and for the mechanical properties, such as the bending tolerance.

A particularly favorable capacity for outputting and introducing light can be achieved in particular if the individual layers of the multiple layer have different refractive indices.

Moreover, the OLED may also include at least one pre-encapsulation layer which can serve as a thermal barrier coating and reduces the thermal load on the OLED during the coating with the layer or layers with a vitreous structure. Moreover, a pre-encapsulation coating can serve to create a stable base for the layer with a vitreous structure.

To protect the layer with a vitreous structure or the other layers in particular from mechanical damage, the OLED may advantageously also have a cover.

In addition, the OLED may advantageously include at least one bonding layer, which preferably adjoins the at least one layer with a vitreous structure. A bonding layer of this type results in improved bonding of the layer with a vitreous structure. As a result, relatively high growth rates and in relative terms smoother layers can be achieved during the deposition. Moreover, a bonding layer of this type can be used to reduce intrinsic layer stresses.

Moreover, an electro-optical element according to the invention may advantageously include structured layers. By way of example, the first and/or second conductive layers and/or the at least one layer which includes at least one organic, electro-optical material may be structured in order to integrate additional functionality in one or more of these layers. In particular, the first and/or second conductive layers may be structured in the form of a comb. The finger electrodes of the layers which are structured in the form of a comb may, for example, engage in one another so that a voltage can be applied or tapped between conductive layers located at one level.

However, other structures of the layers are also suitable. By way of example, the conductive layers may have lines, for example interconnects, which cross one another on the substrate in different levels and allow pixel activation of individually switched pixel structures, in particular for display applications. In this case, the layer which is located between the conductive layers and includes at least one electro-optical material is locally excited to electroluminescence in the vicinity of a cross point of two driven interconnects of the conductive layers. Conversely, a corresponding photovoltaic arrangement can be used for local signal scanning for sensor applications, for example image recording.

Moreover, the invention provides a device for carrying out the production process described above and/or for producing a photoelectric element according to the invention. In addition to the means for producing the OLED layer structure, a device of this type has a coating means for depositing at least one layer with a vitreous structure.

BRIEF DESCRIPTION OF THE DRAWINGS

The invention is described in more detail below on the basis of preferred embodiments and with reference to the appended drawings, in which identical reference numerals in the drawings denote identical or similar parts. In the drawings:

FIG. 6 shows an embodiment with a multilayer encapsulation of the OLED layer structure, FIG. 7 shows an embodiment with a multilayer encapsulation of the OLED layer structure and different refractive indices in the individual layers.

DETAILED DESCRIPTION OF THE INVENTION

Figure 1:
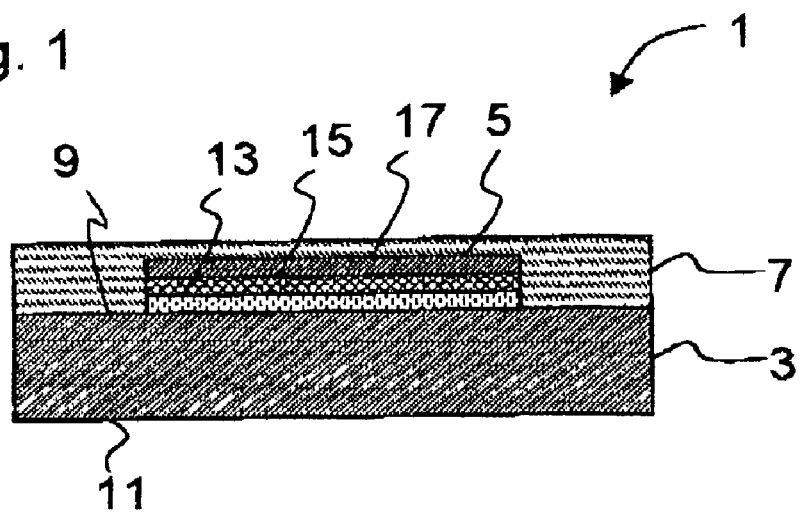
FIG. 1 shows a first embodiment of an OLED according to the invention.

FIG. 1 shows a diagrammatic cross-sectional view through a first embodiment of an OLED according to the invention, which is denoted overall by 1. The OLED comprises a substrate 1, to which an OLED layer structure 5 is applied on one side 9. The layer structure 5 comprises a first conductive layer 13, a layer 15 which includes at least one organic, electro-optical material, and a second conductive layer 17. The layer structure 5 of the OLED is covered with a layer 7 with a vitreous structure and has been applied by means of PVD and/or CVD coating. On account of its low permeability, the layer 7 creates a hermetic encapsulation of the OLED layer structure 5, in particular with respect to small gas molecules from natural atmosphere, such as water or oxygen. In this way, the degradation of the OLED according to the invention as a result of chemical reactions between reactive gases and materials of the layer structure is greatly reduced, and this manifests itself in an increased service life of the OLED. It is preferable for the layer with a vitreous structure to comprise an evaporation-coating glass which has been deposited by evaporation-coating on the element 1.

The layer 15 which includes an organic, electro-optical material is referred to below as an organic, light-emitting layer, for the sake of simplicity. However, this layer may also be designed as a light-absorbing, photovoltaic layer for a photovoltaic element.

The evaporation-coating glass type 8329 produced by Schott, which has the following composition in percent by weight:

| | | |
|---|---|---|
| SiO$_2$ | 84.1% | |
| B$_2$O$_3$ | 11.0% | |
| Na$_2$O | ≈ 2.0% | |
| K$_2$O | ≈ 0.3% | 2.3% (in the layer => 3.3%) |
| Li$_2$O | | |
| Al$_2$O$_3$ | | (in the layer => 0.5%) |
| has proven particularly suitable. | | |

The electrical resistance is approximately $10^{10}$ Ω/cm (at 100° C.).

Furthermore, in the pure form, this glass has a refractive index of approximately 1.470.

The dielectric constant ∈ is approximately 4.8 (at 25° C., 1 MHz), tgδ is approximately $80 \times 10^{-4}$ (at 25° C., 1 MHz). The evaporation-coating process and the differing volatility of the components of this system result in slightly different stoichiometries between the target material and the layer which is applied by evaporation-coating. The deviations in the layer which is applied by evaporation-coating are given in parentheses.

The application of the layer 7 by means of CVD and/or PVD results in the formation of an intimate bonding of the layer 7 both to the surface of the layer structure 5 and to the substrate itself in areas next to the OLED layer structure. As a result, permeability passages at the edge regions of the OLED layer structure are also avoided; in OLEDs which have been known hitherto, such passages are encapsulated, for example by adhesive bonding.

In this embodiment, the substrate is transparent. Light emitted from the organic, light-emitting layer 15 first of all passes through the first conductive layer 13 and then passes through the interface with the environment on the side 11 of the transparent substrate.

In this embodiment, the first conductive layer 13 comprises a transparent, conductive material, such as for example indium tin oxide, in order to allow the light to pass through.

The second conductive layer comprises a material with a lower work function than that of the first conductive layer, the work function in the case of an indium tin oxide layer being approximately 4.9 eV. Calcium is a particularly suitable material for the second conductive layer. However, calcium is highly reactive and reacts in particular with the atmospheric oxygen and with the water which is present as humidity in the air. In particular to protect this layer, hermetic encapsulation of the OLED layer structure is important in order to avoid degradation.

Figure 2:
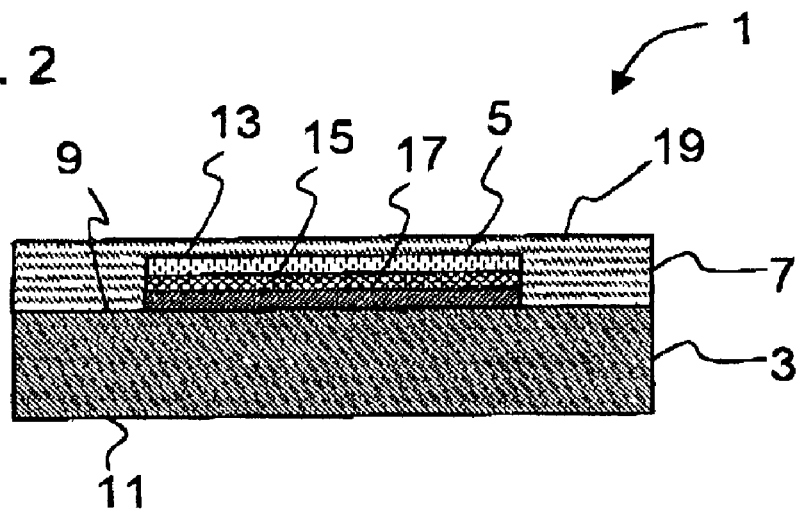
FIG. 2 shows a further embodiment of an OLED according to the invention with an inverse layer structure.

This embodiment of an OLED comprises the layer sequence substrate/first conductive layer/organic, light-emitting layer/second conductive layer. This corresponds to the standard structure of OLEDs. However, a structure with an inverse layer sequence can also be achieved by the application of a layer with a vitreous structure which at the same time effectively encapsulates the OLED layer structure 5. This variant is illustrated in FIG. 2. In the embodiment shown in FIG. 2, the layer sequence is accordingly: substrate/second conductive layer/organic, light-emitting layer/first conductive layer. In this embodiment, the substrate 3 may also comprise an opaque material. The light which is emitted from the organic, light-emitting layer 15 then, after it has passed through the first conductive layer 13, emerges on the outer side 19 through the layer 7 with a vitreous structure.

Figure 3:
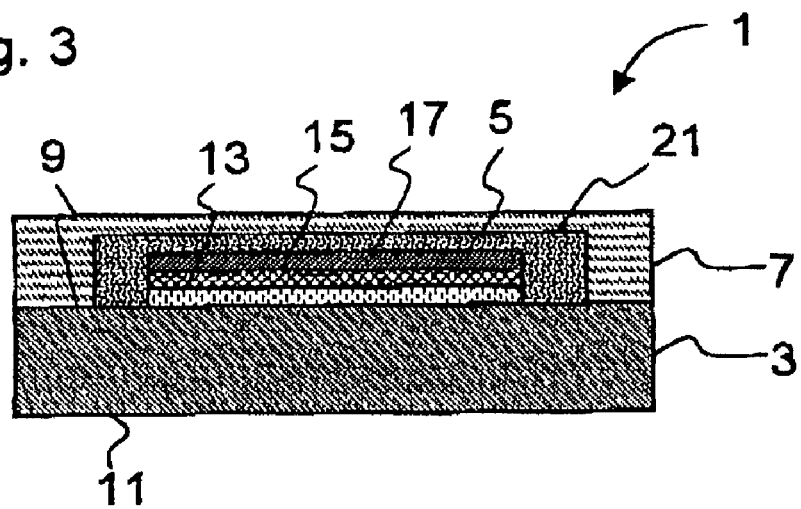
FIG. 3 shows an embodiment of an OLED with a pre-encapsulation layer.

FIG. 3 diagrammatically depicts an embodiment with a pre-encapsulation layer 21. This pre-encapsulation layer is used inter alia to create a stable base for the layer 7 with a vitreous structure. The second conductive layer 17 preferably comprises the very soft metal calcium. The pre-encapsulation layer 21 prevents molecules from the layer 7 penetrating into this layer. Moreover, the layer 21 also forms a thermal barrier coating which, on account of its low thermal conductivity, prevents high levels of heat output from being transferred to the OLED layer structure during the application of the layer 7 with a vitreous structure.

FIGS. 4A to 4D show embodiments of the organic, electro-optical element 1 with an additional cover 23. The cover 23 is used to protect in particular against mechanical damage. Since the layers 13 to 17 of the element 1 may be relatively soft, the layer 7 is joined to a base which is not very stable in the region of the OLED layer structure 5, so that the layer 7 may be sensitive to mechanical effects. The cover 23 may advantageously be adhesively bonded to the OLED. In the embodiment shown in FIG. 4A, the cover 23 is joined to the further components of the element via a synthetic resin or plastic layer 25. The synthetic resin or plastic layer 25 is suitable for compensating for unevenness on the surface, for example caused by the protruding OLED layer structure.

Figure 4A:
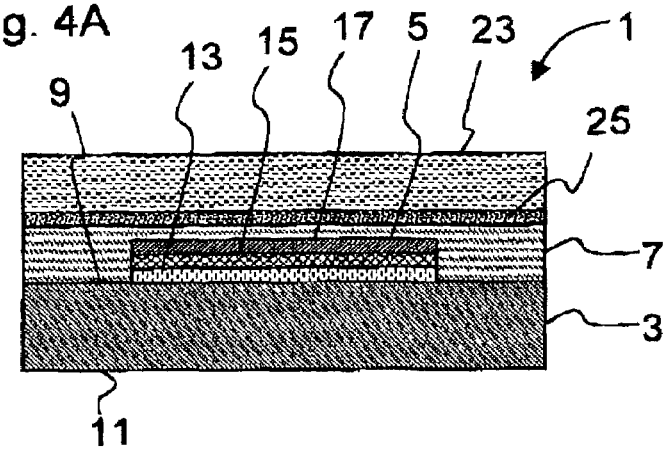
FIGS. 4A to 4E show embodiments with an additional cover to protect the OLED layer structure.
Figure 4B:
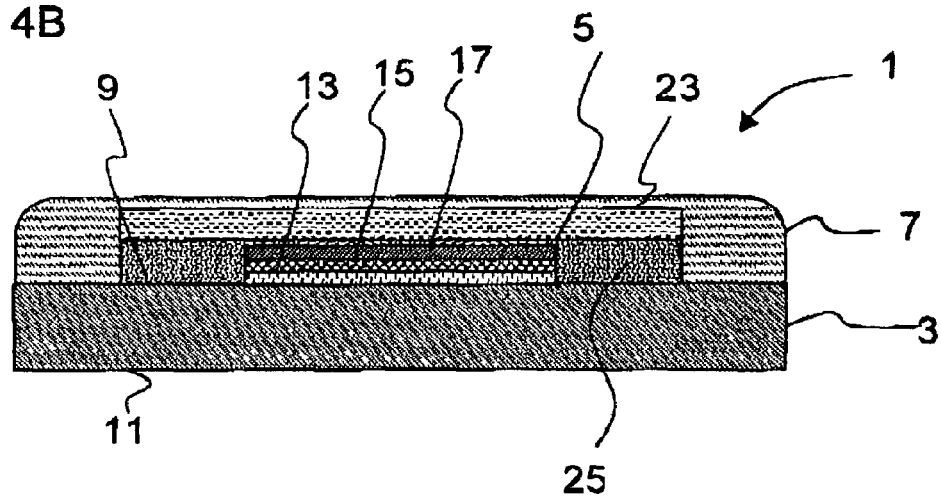

In the embodiment shown in FIG. 4B, the layer 7 with a vitreous structure was deposited in such a way that the boundary edge of the bearing surface of the cover is also covered. For this purpose, the cover 23 was applied to the coated substrate before the layer 7 with a vitreous structure. The layer 7 with a vitreous structure was then deposited on the cover and over its edge which defines the boundary curve of the bearing surface, so that the edge of the cover 23 is sealed by the layer 7. This prevents gases from penetrating between cover and substrate and being able to reach the OLED layer structure 5.

Figure 4C:
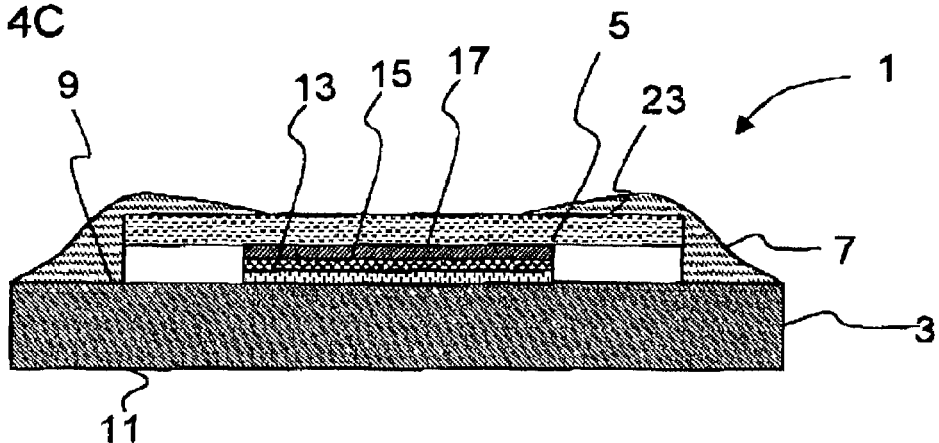

In the embodiment shown in FIG. 4C, adhesive bonding of the cover to the base was dispensed with. In this case, the layer 7 with a vitreous structure is itself used to secure the cover 23. In addition to sealing of the edges of the cover, the deposition of the layer with a vitreous structure accordingly also results in bonding of the cover, in a similar manner to that achieved with a soldering glass, but without the OLED layer structure having to be exposed to any particular thermal load. By way of example, the layer 7 is not designed as a continuous layer, but rather is only deposited on the edges of the cover or the boundary curve of the bearing surface of the cover. Naturally, the layer 7 may also be deposited so as to cover the entire surface of the coated side of the element, in a similar manner to that shown in FIG. 4B.

Figure 4D:
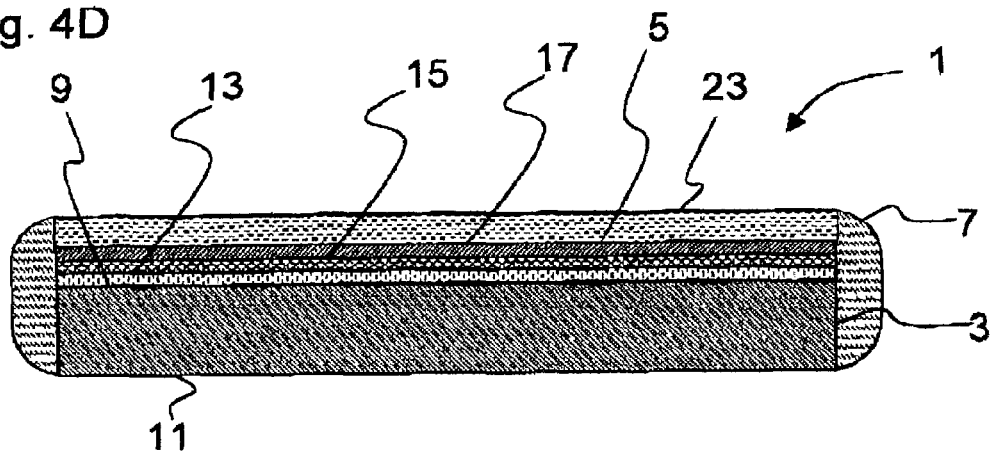

FIG. 4D shows a further embodiment of an element 1 which has been provided with a cover 23 and in which the boundary curve of the bearing surface of the cover is covered with a layer 7 with a vitreous structure. In this case too, as in the embodiment which has been shown with reference to FIG. 4C, in addition to a seal, securing of the cover is also achieved by means of the layer 7. By contrast, however, the layer 7 is evaporation-coated laterally onto the element, so that the edges of the element 1 are sealed.

Figure 4E:
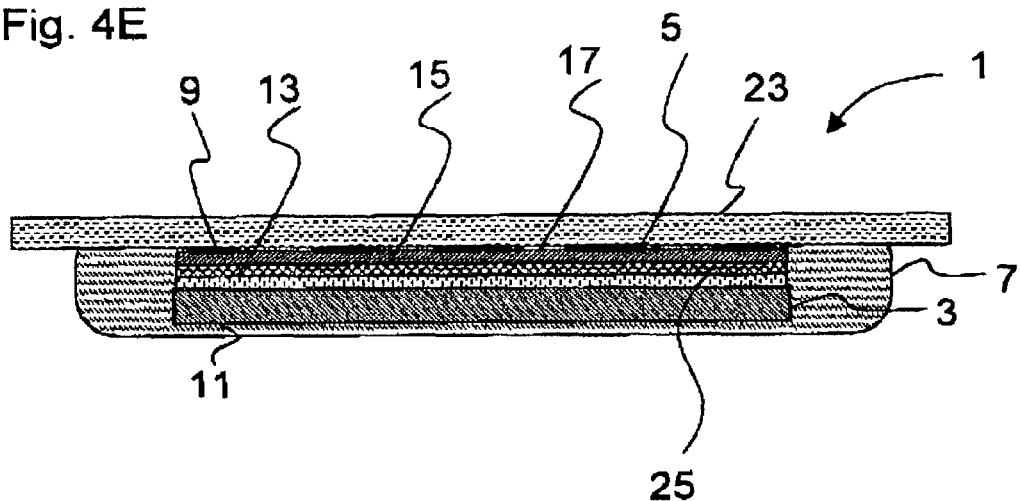

In the embodiment shown with reference to FIG. 4E, a seal, or a hermetic closure, of the OLED layer structure and a securing of a cover 23 was achieved by deposition from the opposite side from the cover. In this case too, a common feature to the embodiments shown in FIGS. 4B, 4C and 4D, the boundary curve of the bearing surface of the cover 23 is covered by the layer 7 with a vitreous structure.

Figure 5:
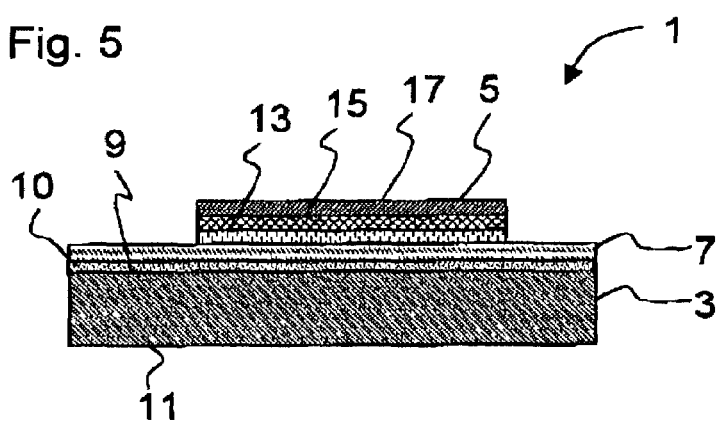
FIG. 5 shows an embodiment of the OLED with the layer with a vitreous structure arranged between the OLED layer structure and the substrate.

FIG. 5 illustrates an embodiment in which the layer with a vitreous structure is applied to the substrate 3 before the application of the first and second conductive layers and of the organic, light-emitting layer. As a result, the layer with a vitreous structure is located between the substrate and the OLED layer structure. In this way, the diffusion through the substrate into the OLED layer structure is suppressed. Moreover, the encapsulation of the OLED from the side of the substrate 3 which is achieved with this arrangement of the layer 7 between OLED layer structure 5 and substrate 3 makes it possible for a material which can be penetrated by gas molecules to be used for the substrate 3. By way of example, in this way it is even possible to use a plastic substrate through which gas molecules would otherwise migrate into the OLED layer structure on account of the poor barrier action of plastics. The use of plastic substrates is particularly suitable for the production of flexible OLEDs.

Moreover, the OLED may include a bonding layer 10 for joining the layer 7 with a vitreous structure to a plastic substrate. The bonding layer 10 adjoins the layer 7 with a vitreous structure and is located between substrate 3 and layer 7. The bonding layer 10 creates a fixed and permanent join between the layer 7 with a vitreous structure and the substrate 3, so that separation of the layer 7 from the flexible substrate 3 in particular when the OLED is bent can be prevented. Of course, it is also possible for the embodiments which have been described above and those which are described below to include bonding layers of this type.

In addition, a further encapsulation (not shown in FIG. 5) can hermetically seal the OLED layer structure 5, this encapsulation preferably likewise being effected by application of a layer with a vitreous structure by means of CVD and/or PVD coating. The layer with a vitreous structure which is applied between the OLED layer structure 5 and the substrate 3 may, in addition to its function as a diffusion barrier, also serve to match refractive indices between OLED layer structure 5 and substrate 3, in order to improve the outputting of the light emitted from the organic layer 15.

In the case of OLEDs with flexible substrates 3 which are constructed as shown in FIG. 5, the layer 7 should run as far as possible along the neutral fiber of the structure, so that it is impossible for any cracks which could increase the degradation again to form in this layer when the OLED is bent. FIG. 6 shows an embodiment in which a multiple layer 27 has been applied, in order to increase the flexibility of the structure. In this case, the multiple layer 27 is applied to the side 9 of the substrate, between substrate 3 and OLED layer structure 5. In this embodiment, the multiple layer 27 comprises N layers with a vitreous structure 71, 72, ..., 7N.

N flexible layers 81, 82, ..., 8N are applied alternately with these layers 71, 72, ..., 7N. The flexible layers 81, 82, ..., 8N may, by way of example, comprise polymer layers. If the OLED is bent, shear forces occur between the individual layers. The shear forces are absorbed by deformation of these layers on account of the flexibility of the layers 81 to 8N. Of course, the same principle can also be applied to the opposite side of the OLED layer structure in order to completely and, at the same time, flexibly encapsulate the OLED layer structure 5.

In each case for the sake of clarity, the encapsulation of the OLED layer structure on the opposite side from the substrate is not illustrated in FIGS. 5 and 6.

FIG. 7 shows, in a similar manner to the embodiment illustrated in FIG. 6, an OLED according to the invention with a multiple layer 27 which comprises layers 71, 72, ..., 7N with a vitreous structure and further layers 81, 82, ..., 8N. Unlike in the embodiment shown in FIG. 6, however, in this case the layers are applied to the opposite side 11 of the substrate 3 from the side 9 to which the OLED layer structure 5 is applied. An encapsulation of the OLED layer structure 5 similar to the embodiments illustrated with reference to FIGS. 1 to 4 by a layer 7 with a vitreous structure is additionally illustrated.

In this case, the multiple layer 27, in addition to the barrier action which is achieved by the layers 71 to 7N, is also used for refractive index matching in order to improve the output of the light emitted by the organic layer 15 at the interface between the OLED and the environment. The individual layers 71 to 7N and 81 to 8N of the multiple layer 27 for this purpose have different refractive indices. In particular, the layer 27 is constructed in such a way that the layers 71 to 7N with a vitreous structure have the same refractive indices and the layers 81 to 8N likewise have the same refractive indices. In this way, the refractive index alternates from layer to layer through the alternating arrangement of the layers.

However, a variation in the refractive index can be produced not only by combining different layers. Rather, it is also possible for a layer with a vitreous structure to have a composition which varies along the direction perpendicular to the coated surface and/or a refractive index which varies along this direction. A variation in the refractive index is preferably also changed by varying the layer composition. However, variation by means of a layer morphology which changes along this direction, for example a changing density, is also conceivable. Layers with a variation in the refractive index as a result of changing layer compositions can be produced by depositing the layer by means of co-evaporation, the evaporation-coating rate of at least one of the evaporation sources being changed during the evaporation-coating process. Therefore, a periodic change in the evaporation-coating rate, for example by periodically changing the output from one of the sources, makes it possible to produce a corresponding layer with a vitreous structure which has a refractive index which varies periodically perpendicular to the coated surface.

Figure 8A:
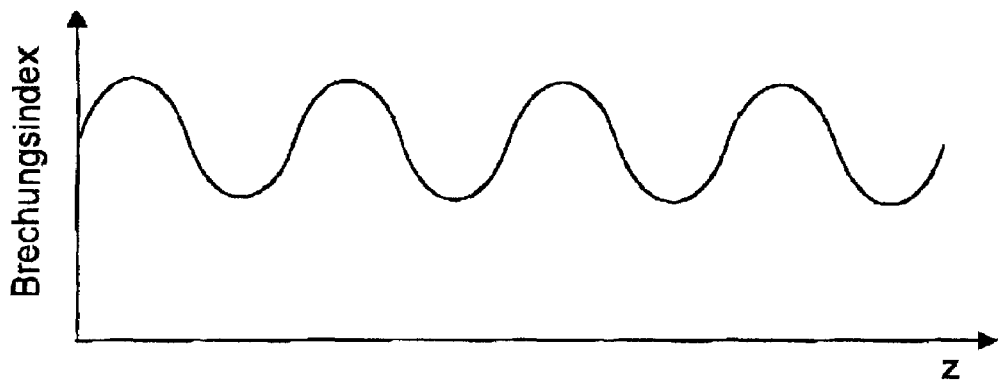
FIGS. 8A and 8B show the curve of the refractive index in a layer with a vitreous structure in accordance with two further embodiments of an OLED.
Figure 8B:
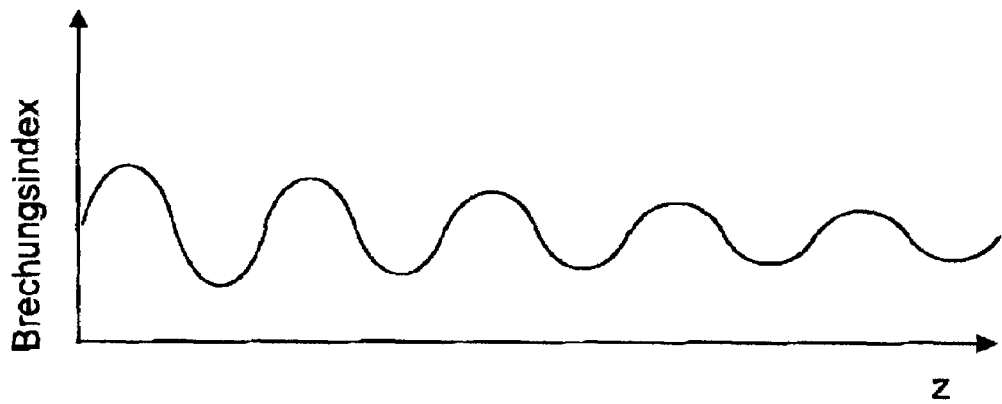

Such a curve of the refractive index is illustrated by way of example in FIGS. 8A and 8B. The coordinate z in these figures indicates the direction perpendicular to the coated surface. Both curves reveal a periodic variation in the refractive index in the z direction. The curve of the refractive index illustrated in FIG. 8B has, in addition to the periodic variation, a decrease in the amplitude in the z direction, which may additionally be of benefit to the outputting and introduction efficiency of the element.

Figure 9:
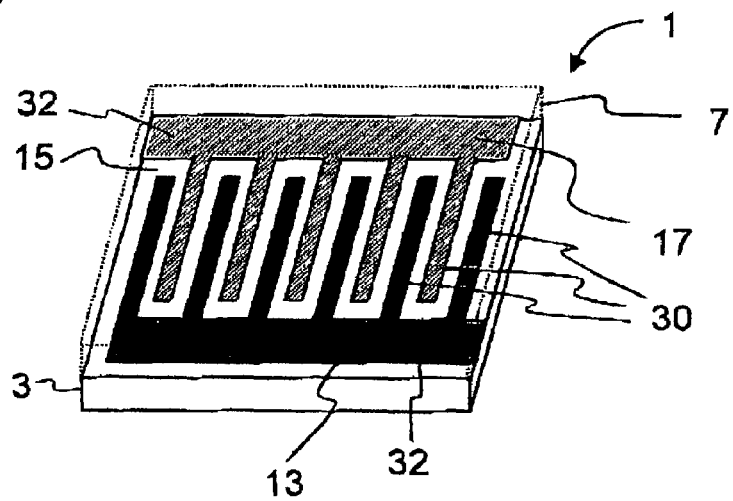
FIG. 9 shows an embodiment of an OLED with conductive layers structured in the form of a comb.

Finally, FIG. 9 shows a further embodiment of an OLED or of an organic, electro-optical element, which has structured functional layers. In this embodiment, the conductive layers 13 and 17 are structured in the form of a comb and are both located at the same level on the substrate 3. The layers 13 and 17 each have finger electrodes 30 which are connected to at least one web 32. The voltage supply or voltage tap in the case of a photovoltaic element is effected via the webs 32. The layer 15 which includes at least one organic, electro-optical material is applied to the structured layers 13 and 17, so that there is also material of the layer 15 between the finger electrodes. In this exemplary embodiment, in order to be encapsulated, the OLED layer structure produced in this way is once again, in a similar manner to the embodiment which has been explained with reference to FIG. 1, covered with a layer 7 with a vitreous structure.

Of course, the exemplary embodiments which have been presented above can also be combined in a wide range of ways, for example by layers with a vitreous structure being applied to a plurality of sides of the substrate. For example, inter alia, the embodiment shown with reference to FIG. 7 can be combined with a coating on that side of the substrate which faces the OLED layer structure 5, for example as in the embodiments shown in FIG. 5 or 6. Also, virtually any other desired combinations of the embodiments which have been shown are possible. It is also possible for all the embodiments to be used in pixel displays, for example by using a matrix arrangement of the elements described or by using correspondingly structured conductive layers with interconnects which cross one another.

LIST OF REFERENCE SYMBOLS

| | |
|---|---|
| 1 | Organic, electro-optical element |
| 3 | Substrate |
| 5 | OLED layer structure |
| 7, 71, 72, . . . , 7N | Layer with a vitreous structure |
| 9 | First side of the substrate |
| 10 | Bonding layer |
| 11 | Second side of the substrate |
| 13 | First conductive layer |
| 15 | Organic, light-emitting layer |
| 17 | Second conductive layer |
| 19 | Outer side of the OLED |
| 21 | Pre-encapsulation layer |
| 23 | Cover |
| 25 | Adhesive bonding |
| 27 | Multiple layer |
| 30 | Finger electrodes |
| 32 | Web |
| 81, 82, . . . , 8N | Layers of the multiple layer 27 |

The invention claimed is:

1. A process for producing an organic, electro-optical element, comprising the steps of:
providing a substrate,
applying a first conductive layer,
applying at least one layer which includes at least one organic, electro-optical material,
applying a second conductive layer, and
depositing at least one glass layer with a vitreous structure, the at least one lass layer comprising an at least binary system of materials, wherein the step of depositing at least one glass layer comprises the step of evaporation-coating, in which the step of evaporation-coating comprises the step of electron-beam coating, wherein the step of evaporation-coating comprises the step of co-evaporation from at least two evaporation sources, and wherein the step of co-evaporation comprises the step of periodically varying the evaporation-coating rate of at least one of the evaporation sources.

2. A process for producing an organic, electro-optical element, comprising the steps of:
providing a substrate,
applying a first conductive layer,
applying at least one layer which includes at least one organic, electro-optical material,
applying a second conductive layer, and
depositing at least one glass layer with a vitreous structure, the at least one glass layer comprising an at least binary system of materials, wherein the step of depositing at least one glass layer comprises the step of evaporation-coating, and wherein the step of depositing the at least one glass layer takes place before the application of one of the conductive layers.

3. An organic electro-optical element, comprising:
a substrate,
a first conductive layer,
at least one layer which includes at least one organic, electro-optical material,
a second conductive layer, and
at least one deposited glass layer with a vitreous structure and an at least binary system of materials, wherein the at least one deposited glass layer is applied by evaporation-coating and wherein the at least one deposited glass layer is arranged between the substrate and the first conductive layer or second conductive layer.

4. An organic electro-optical element, comprising:
a substrate,
a first conductive layer,
at least one layer which includes at least one organic, electro-optical material,
a second conductive layer, and
at least one deposited glass layer with a vitreous structure and an at least binary system of materials, wherein the at least one deposited glass layer is applied by evaporation-coating, and wherein the at least one deposited glass layer is located on the opposite side of the substrate from the side on which the at least one layer which includes at least one organic, electro-optical material is located.

5. An organic electro-optical element, comprising:
a substrate,
a first conductive layer,
at least one layer which includes at least one organic, electro-optical material,
a second conductive layer, and
at least one deposited layer with a substantially amorphous structure applied by evaporation-coating and comprising an at least binary system of materials, wherein the at least one deposited layer comprises an at least binary system of materials, and wherein the at least one layer with an amorphous structure is located on the opposite side of the substrate from the side on which the at least one layer which includes at least one organic, electro-optical material is located.

6. A process for producing an organic, electro-optical element, comprising the steps of:
providing a substrate,
applying a first conductive layer,
applying at least one layer which includes at least one organic, electro-optical material,
applying a second conductive layer, and
depositing at least one glass layer with a vitreous structure, the at least one glass layer comprising an at least binary system of materials, wherein the step of depositing at least one glass layer comprises the step of evaporation-coating, wherein the step of evaporation-coating comprises the step of co-deposition of organic material.

7. The process as claimed in claim 6, wherein one of the conductive layers has a lower work function than the other conductive layer.

8. The process as claimed in claim 6, further comprising a step selected from the group consisting of applying at least one hole injection layer, applying a potential matching layer, applying an electron blocker layer, applying a hole blocker layer, applying an electron conductor layer, applying a hole conductor layer, applying an electron injection layer, and any combinations thereof.

9. The process as claimed in claim 6, wherein at least one of the conductive layers is at least partially transparent to light emitted from the at least one layer which includes at least one organic, electro-optical material.

10. The process as claimed in claim 9, wherein the conducting layers include at least one of indium tin oxide and fluorine-doped tin oxide.

11. The process as claimed in claim 9, wherein the at least one glass layer is deposited after the application of the at least one layer which includes at least one organic, electro-optical material.

12. The process as claimed in claim 6, wherein at least one of the first conductive layer, the second conductive layer and the at least one layer which includes at least one organic, electro-optical material are applied in structured form.

13. The process as claimed in claim 12, wherein at least one of the first conductive layer and the second conductive layer are applied such that they are structured in a comb shape.

14. The process as claimed in claim 6, wherein the step of depositing the at least one glass layer takes place after the application of the first conductive layer, the second conductive layer and the at least one layer which includes at least one organic, electro-optical material.

15. The process as claimed in claim 6, wherein the step of depositing the at least one glass layer comprises the step of depositing a glass layer on the opposite side of the substrate from the side to which the at least one layer which includes at least one organic, electro-optical material is applied.

16. The process as claimed in claim 6, wherein the step of depositing the at least one glass layer takes place before the application of the first conductive layer, the second conductive layer and the at least one layer which includes at least one organic, electro-optical material.

17. The process as claimed in claim 6, wherein the step of depositing the at least one glass layer comprises the step of applying a multiple layer.

18. The process as claimed in claim 17, wherein the step of applying a multiple layer comprises the step of applying a multiple layer with different chemical compositions and/or different mechanical properties of at least two individual layers of the multiple layer.

19. The process as claimed in claim 18, wherein the individual layers of the multiple layer have different refractive indices.

20. The process as claimed in claim 6, further comprising the step of applying a pre-encapsulation layer.

21. The process as claimed in claim 6, further comprising the step of applying a cover.

22. A process for producing an organic, electro-optical element, comprising the steps of:
providing a substrate,
applying a first conductive layer,
applying at least one layer which includes at least one organic, electro-optical material,
applying a second conductive layer,
depositing at least one glass layer with a vitreous structure, the at least one glass layer comprising an at least binary system of materials, wherein the step of depositing at least one glass layer comprises the step of evaporation-coating; and
applying a cover, wherein the step of depositing at least one glass layer comprises the step of covering a boundary edge of a bearing surface of the cover with the least one glass layer.

23. The process as claimed in claim 22, further comprising the step of applying at least one bonding layer to which the at least one glass layer is applied.

24. An organic electro-optical element, comprising:
a substrate,
a first conductive layer,
at least one layer which includes at least one organic, electro-optical material,
a second conductive layer, and
at least one deposited glass layer with a vitreous structure and an at least binary system of materials, wherein the at least one deposited glass layer is applied by evaporation-coating to form a coated surface, wherein the at least one deposited glass layer has a composition which varies along at least one of the direction perpendicular to the coated surface and a refractive index which varies along this direction.

25. The element as claimed in claim 24, wherein one of the conductive layers has a lower work function than the other of the conductive layers.

26. The element as claimed in claim 24, wherein at least one of the conductive layers is at least partially transparent to a light which is emitted by the at least one layer which includes at least one organic, electro-optical material.

27. The element as claimed in claim 26, in which the at least partially transparent, conductive layer includes at least one of indium tin oxide and fluorine-doped tin oxide.

28. The element as claimed in claim 24, further comprising a periodic variation in at least one of the composition and the refractive index of the at least one deposited glass layer along the direction perpendicular to the coated surface.

29. The element as claimed in claim 24, further comprising a multiple layer which comprises at least one layer with a vitreous structure.

30. The element as claimed in claim 29, wherein the individual layers of the multiple layer have different refractive indices.

31. The element as claimed in claim 24, further comprising at least one pre-encapsulation layer.

32. The element as claimed in claim 24, further comprising a layer selected from the group consisting of at least one hole injection layer, at least one potential matching layer, at least one electron blocker layer, at least one hole blocker layer, at least one electron conductor layer, hole conductor layer and at least one electron injection layer.

33. The element as claimed in claim 24, further comprising a cover.

34. An organic electro-optical element, comprising:
a substrate,
a first conductive layer,
at least one layer which includes at least one organic, electro-optical material,
a second conductive layer,
at least one deposited glass layer with a vitreous structure and an at least binary system of materials, wherein the at least one deposited glass layer is applied by evaporation-coating, and
a cover, wherein a boundary edge of a bearing surface of the cover is covered with at least one layer with a vitreous structure.

35. The element as claimed in claim 34, further comprising a bonding layer which adjoins the at least one deposited glass layer.

36. The element as claimed in claim 34, wherein at least one of the first conductive layer, the second conductive layer, and the at least one layer which includes at least one organic, electro-optical material are structured.

37. The element as claimed in claim 36, wherein at least one of the first conductive layer and the second conductive layer are structured in the form of a comb.

* * * * *